United States Patent
Von Bünau et al.

(10) Patent No.: US 6,445,442 B2
(45) Date of Patent: Sep. 3, 2002

(54) PROJECTION-MICROLITHOGRAPHIC DEVICE

(75) Inventors: Rudolf Von Bünau, Essingen; Jörg Schultz, Aalen; Johannes Wangler, Königsbronn, all of (DE)

(73) Assignee: Carl-Zeiss-Stiftung (DE)

( * ) Notice: Subject to any disclaimer, the term of this patent is extended or adjusted under 35 U.S.C. 154(b) by 0 days.

(21) Appl. No.: 09/932,355

(22) Filed: Aug. 20, 2001

Related U.S. Application Data (63) Continuation-in-part of application No. 09/457,503, filed on Dec. 8, 1999, now abandoned.

(30) Foreign Application Priority Data

Dec. 8, 1998 (DE) .......................................... 198 56 575

(51) Int. Cl.[7] .................... G03B 27/54; G03B 27/42; G03B 27/52
(52) U.S. Cl. ............................. 355/67; 355/53; 355/55
(58) Field of Search ............................ 355/53, 55, 52, 355/67–71, 77; 430/5, 22, 30; 250/548; 359/649, 661

(56) References Cited

U.S. PATENT DOCUMENTS

| | | | | |
|---|---|---|---|---|
| 5,194,893 A | * | 3/1993 | Nishi .......................... 355/53 |
| 5,420,417 A | * | 5/1995 | Shiraishi ...................... 250/205 |
| 5,572,287 A | * | 11/1996 | Wangler et al. ................ 355/53 |
| 5,982,558 A | * | 11/1999 | Furter et al. .................. 359/649 |
| 5,991,009 A | * | 11/1999 | Nishi et al. .................... 355/70 |
| 6,067,146 A | * | 5/2000 | Mulkens et al. ............... 355/71 |
| 6,213,607 B1 | * | 4/2001 | Watanabe et al. ........... 359/601 |
| RE37,391 E | * | 9/2001 | Nishi .......................... 355/53 |

* cited by examiner

Primary Examiner—Russell Adams
Assistant Examiner—Hung Henry Nguyen

(57) ABSTRACT

An illuminating device of a projection-microlithographic device includes a light source, an objective, and a device which produces a particular image field configuration. The device has fields which, in the direction of scanning movement, are separated at least in parts by a free zone, and are located in a peripheral region of the circular image field of a downstream projection objective in a manner at least approximating rotation symmetry. The integral of the quantity of light passing through the fields in the scanning direction are constant over the entire extent of the image field configuration in the direction at right angles to the scanning direction. Such an image field configuration replaces a conventional rectangular scanner slot formation whose width in the scanning direction corresponds to the forementioned integral of the image field configuration. The design of the image field configuration permits an approximately rotationally symmetric illumination of the projection objective.

25 Claims, 9 Drawing Sheets

PROJECTION-MICROLITHOGRAPHIC DEVICE

CROSS-REFERENCES TO RELATED APPLICATIONS

This is a CIP application to U.S. Patent Application Ser. No. 09/457,503 filed Dec. 8, 1999 now abandoned of the same inventor, the priority of which is claimed for this CIP application.

BACKGROUND OF THE INVENTION

1. Filed of the Invention

The invention relates to a projection-microlithographic device having: a projection-microlithographic apparatus having: an illuminating device which itself comprises: a light source; a device which produces an image field configuration in a reticle plane; being designed such that an image field configuration is produced by a transformation of an initial rectangle having a long side and a short side with an aspect ratio greater than 1:5, said transformation being such as to keep the area and, in the direction of the long side of the rectangle, the total dimension constant; said generated image field configuration having at least two closed curves as periphery; a reticle holder which is designed to accommodate a reticle in the reticle plane and is movable in a scanning direction; and a projection objective imaging a pattern of the reticle located in the reticle plane onto a wafer plane.

In projection-microlithographic devices of this kind, the individual chips on the semiconductor wafer arranged beneath the projection objective are not exposed all over, but in a scanning movement in which both the reticle holder and the wafer holder are moved linearly at a generally constant speed and in synchronism with one another in a direction referred to as the scanning direction or y-direction. To achieve the largest possible dimension of the projection image in the direction at right angles to the scanning direction (x-direction) with the smallest possible objective diameters, image field configurations in the form of rectangular slots are normally used. The narrow side of these rectangles extends in the scanning direction.

2. Description of the Technical Field, Including Information Disclosed Under 37 CFR 1.97 and 1.98

It is known that the rectangular slot formation, with which the lenses of the projection objective are illuminated non-rotationally symmetrically, leads to non-rotationally symmetric imaging errors of the projection objective caused by lens heating and/or compaction. To eliminate and compensate for these non-rotationally symmetric imaging errors, a large number of approaches have been adopted, the principle of which is always the same: The imaging properties of the projection objective are to be symmetrized by means of a likewise non-rotationally symmetric measure complementary to the non-rotationally symmetric imaging errors of the projection objective. Such measures include non-rotationally symmetric heating or cooling, or mechanical deformation, of lenses. Apart from the fact that the subsequent compensation of non-rotationally symmetric imaging errors cannot always be performed optimally and often is accompanied by time characteristics that are difficult to manage, subsequent compensation normally involves a considerable additional outlay in terms of apparatus and corresponding costs.

An example of a projection-microlithograhic device of the type defined which attempts to compensate for non-rotationally symmetric imaging errors by means of additional measures is given in EP 0 823 662 A. Here, in addition to the light serving for illuminating purposes, additional light from other light sources is also sent through the projection objective; this additional light results in an overall symmetrization of the irradiation of the lenses of the objective, but is unsuitable for, or does not participate in, the exposure of the wafer. Obviously the additional light sources and optical components required for the input into the projection objective constitute a considerable cost outlay; moreover, the projection objective is subjected to additional, unnecessary thermal stress.

U.S. Pat. No. 5,473,410 also describes a projection-microlithographic device of the type referred to in the introduction. Here FIGS. 2A and 2B illustrate image field configurations in the form of a regular hexagon. This image field configuration has the following purpose: To minimize the projection objective diameter, the exposure of the chips on the wafer in the y-direction takes place not in one single scanning process but in a plurality of scanning processes performed in parallel to one another ("stitching" process). To avoid exposure inhomogeneities at the edges, extending in parallel to the scanning direction, of the thus produced "exposure strips", the boundary lines of the image field configuration extend not in parallel to the scanning direction but obliquely thereto. A junction zone between adjacent "exposure strips" therefore is overlappingly exposed in two consecutive scanning processes. In concrete terms, the aforementioned form of a regular hexagon is selected for the image field configuration for this purpose. However, a side effect of this image field configuration, which is not acknowledged in U.S. Pat. No. 5,473,410, is that the illumination of the projection objective takes place approximately rotationally symmetrically and therefore non-rotationally symmetric imaging errors are prevented from the start or occur only to a small extent. The described image field configuration is only suitable however for "stitching" with overlapping exposure.

Also known are scanners with catadioptric or catoptric objectives which, due to beam shading of the mirrors and in accordance with the best image correction zone, image an extra axial ring sector. In such scanners, as in the case of so-called steppers operating with square image field configurations, the problem of asymmetric lens heating discussed here does not arise.

BRIEF SUMMARY OF THE INVENTION

The aim of the present invention is to develop a projection-microlithographic device of the type referred to in the introduction, such that radiation induced, non-rotationally symmetric imaging errors of the projection objective are substantially avoided from the start, and that each individual chip on the wafer can be exposed in one single scanning process of the established type.

This aim is achieved, in accordance with the invention by a projection-microlithographic apparatus having: an illuminating device which itself comprises: a light source; a device which produces an image field configuration in a reticle plane; being designed such that an image field configuration is produced by a transformation of an initial rectangle having a long side and a short side with an aspect ratio greater than 1:5, said transformation being such as to keep the area and, in the direction of the long side of the rectangle, the total dimension constant; said generated image field configuration having at least two closed curves as periphery; a reticle holder which is designed to accommodate a reticle in the reticle plane and is movable in a scanning direction; a projection objective imaging a pattern of the reticle located in the reticle plane onto a wafer plane.

The device that produces the image field configuration is designed such that both the corners of the initial rectangle from which the image field configuration is generated and at least the outer corners of the image field configuration generated from this initial rectangle are located on a circular boundary line. This boundary line may coincide with a boundary line of a circular corrected image field of the projection objective or may define the outer boundary of an image field configuration lying within the circular corrected image filed of the projection objective. Therefore, the circular boundary line defined by the outer corners of the image filed configuration is not necessarily coincident with the boundary line of the corrected image field. Always, the image field configuration produced is located within the circular corrected image field.

The invention is based on the recognition that, whilst retaining an aspect ratio which applies to a classic rectangular slot formation, it is possible to achieve an image field configuration that is located more exactly in the peripheral region of the circular, corrected image field, so that the heat discharge is simplified and in this way heat induced imaging errors in the projection objective can be reduced.

In an embodiment of the invention the device that produces the image field configuration is designed such that the image field configuration fulfils the following conditions:

the device comprises fields which in the y-direction are separated from one another at least in parts by a free field and, in a manner at least roughly approximating rotation symmetry, are located in the peripheral region of the circular image field of the projection objective;

the integral of the quantity of light passing through the fields in the y-direction is constant over the entire extent of the image field configuration in the direction (x-direction) at right angles to the y-direction.

This embodiment of the invention departs, for the first time, from the hitherto widely applied principle that the image field configuration must consist of a cohesive surface. It is recognized that the exposure effect of a narrow scanner slot can also be equivalently replaced by a plurality of fields which are no longer directly joined up but are distributed in the peripheral region of the circular, corrected or correctable image field of the projection objective, such that they approximate rotation symmetry more closely than a narrow rectangular slot. The correction of the objective then need not include the unused regions. This at least roughly approximated rotation symmetry prevents radiation induced, non-rotationally symmetric imaging errors of the projection objective from the start, thus without compensatory measures. However, the exposure effect of the image field configuration according to the invention corresponds to that of the narrow, known scanner slot since, in the fields which constitute the image field configuration, the integral of the light quantity measured in the y-direction is constant over the entire extent of the image field configuration in the x-direction, i.e. corresponds to the width of the conventional slot. A disadvantage of the image field configuration according to the invention is that a slightly greater scanning movement of the reticle holder and of the wafer holder (overscan) is required, as the image field configurations according to the invention have a larger overall dimension in the y-direction than a conventional, narrow scanner slot.

If the illumination is homogeneous, a "constant integral of the light quantity" in the y-direction can be achieved very easily by means of a constant integral of the dimension of the fields in the y-direction.

The detailed description sets forth image field configurations which fulfil the above mentioned purpose and can generally be achieved using relatively simple illuminating devices.

The detailed description discloses an illuminating device that corresponds closely to already existing illuminating devices, and thus entails a relatively minor modification of these already existing devices. It utilizes one or more glass rods as homogenizer in a manner similar to that described in U.S. Pat. No. 5,473,408. This is relatively cost effective and also opens up the possibility of retrofitting already existing devices.

The same applies to the means described in the specification, which permit a substantially loss-free, homogeneous illumination of the glass rods which constitute the device according to the invention that produces the image field configuration.

The detailed description sets forth a design of the device that produces the image field configuration comprising a prism honeycomb condenser, another low-cost option that can be retrofitted.

DETAILED DESCRIPTION OF THE SEVERAL VIEWS OF THE DRAWINGS

Exemplary embodiments of the invention will be explained in detail in the following making reference to the drawings in which.

DETAILED DESCRIPTION OF THE INVENTION

Figure 1:
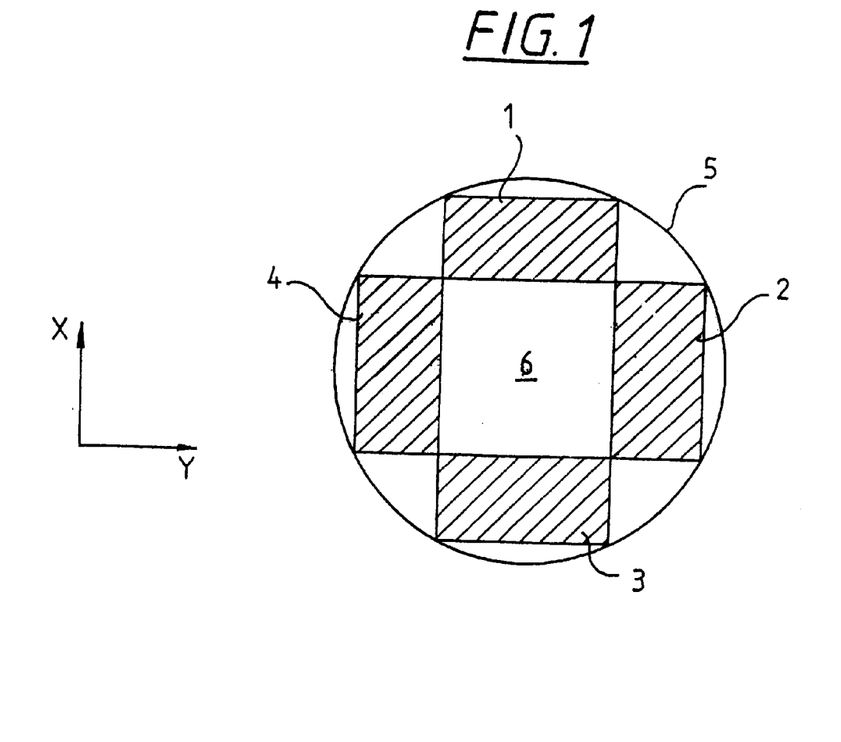
FIG. 1 schematically illustrates a first image field configuration for illuminating the reticle in a projection exposure device.

In FIG. 1 the shaded fields 1, 2, 3 and 4 together represent an image field configuration that is used to illuminate the reticle in a projection-microlithographic device. This reticle is moved at a continuous speed in the direction of the y-axis of the illustrated, rectangular coordinate system, as is typical in a scanning process. The overall extent of the image field configuration in the direction at right angles to the scanning direction, thus in the x-direction, is such that the complete structure of one or more chips is exposed in one single scanning process and thus a plurality of parallel scanning processes are no longer required to fully expose the chip structure.

The overall image field configuration comprising the fields 1 to 4 is located within the circular, corrected image field of the downstream projection objective; the circular boundary line of this circular corrected image field bears the reference symbol 5.

The exposure function of the image field configuration shown in FIG. 1 corresponds to that of a conventional slot with an aspect ratio of 2:1. All four fields 1, 2, 3, 4 are formed by rectangles that themselves possess the same aspect ratio 2:1. With their sides facing towards the center of the circular, corrected image field, they adjoin one another such that they enclose a free, square, central field 6. The arrangement of the fields 1 to 4 thus is such that four-fold rotation symmetry exists with respect to the central axis of the circular corrected image field of the projection objective extending at right angles to the drawing plane in FIG. 1. At the same time, double mirror symmetry exists with respect to the center lines of FIG. 1 extending in parallel to the y- and x-axis.

As regards the image field configuration illustrated in FIG. 1, it can easily be seen that, over its entire extent in the x-direction, the integrated dimension in the y-direction, i.e. the sum of the dimensions of the individual fields 1, 2, 3, 4 in the y-direction, is constant: Moving from bottom to top in FIG. 1, this integrated dimension initially plainly corresponds to the dimension of the field 3 in the y-direction. In the upwardly adjoining region of the image field configuration, the two fields 4 and 2 must be taken into consideration. As the dimension of these fields in the y-direction in each case corresponds to half the dimension of the field 3, the integrated dimension of the image field configuration in the region of the fields 4, 2 is the same as in the region of the field 3. In the upwardly adjoining region of the field 1 in FIG. 1, the same conditions prevail as in the lowest region of the field 3.

FIG. 1 can also be interpreted in that the regions of a conventional slot with an aspect ratio 2:1 located within the empty, central field 6 have been symmetrically "folded outwards". This view particularly clarifies the fact that, with the image field configuration illustrated in FIG. 1, it is basically possible to achieve the same exposure results on the chip as with the conventional rectangular slot on which the image field configuration according to FIG. 1 is based.

By means of the modification relative to a rectangular slot according to FIG. 1, the image field configuration is "symmetrized": Although full rotation symmetry is not achieved, and as stated only four-fold symmetry is achieved, the non-rotationally symmetric, heat induced imaging errors of the projection objective which still occur are considerably smaller than in the case of the rectangular slot shape. Furthermore, the heat discharge is simplified as the central field 6, from which the heat discharge is particularly problematic, is not irradiated.

In the case of the image field configuration illustrated in FIG. 1, the fields 1 to 4 do not overlap in the x-direction with adjacent fields in the x-direction. If the fields 1 to 4 are not very precisely delimited and positioned in the x-direction, inhomogeneities can therefore occur at the "joints" between the three juxtaposed strips exposed on the chip through the fields 1 to 4. These problems are avoided by means of the slight modification of the image field configuration illustrated in FIG. 2.

Figure 2:
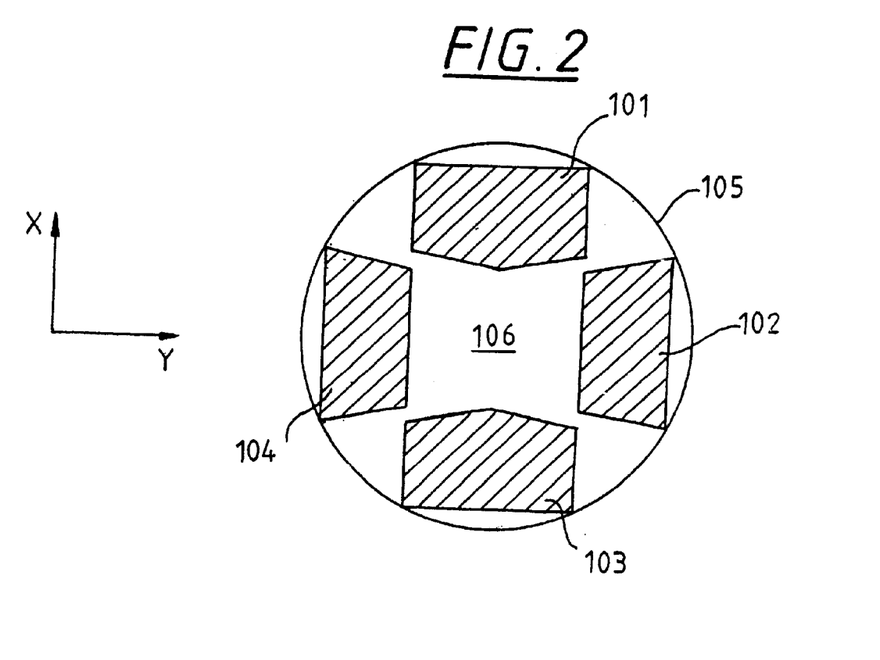
FIG. 2 illustrates a modification of the image field configuration illustrated in FIG. 1.

The basic arrangement of this second image field configuration substantially corresponds to that shown in FIG. 1: Here again four fields 101, 102, 103, 104 are provided that leave a field 106 free at the center. The fields 101 to 104 of the image field configuration are now no longer exact rectangles however; neither is the central, free field 106 an exact square. Rather, a slight modification of the rectangular shapes, as shown in broken lines in FIG. 2, produces the following shapes for the fields 101 to 104:

The fields 102 and 104, whose longer dimension extends in the x-direction, have the shape of equal sided trapeziums, where the shorter of the two parallel boundary lines faces towards the central field 106. These fields 102 and 104 are formed from the basic rectangular shape by "cutting off" small triangles on the sides extending in the y-direction.

The fields 101 and 103, whose longer dimension extends in the y-direction, have the shape of "houses", i.e. the shape of rectangles with triangles attached thereto with the apexes of the triangles facing inwards. These fields 101 and 103 can be imagined to have been formed by cutting off right angled triangles from a rectangle whose dimension in the x-direction is extended by the length of the smaller of the short sides of these triangles relative to the fields 1 and 3 according to FIG. 1, as indicated by the broken lines in FIG. 2.

However, the fields 101 and 103 can also be imagined to have been formed as follows: The triangles cut off from the lateral fields 102, 104 are attached to the rectangles of the fields 1 and 3 according to FIG. 1 by parallel displacement in the direction of the positive and negative y-axis. This view clarifies the fact that the basic condition for an image field configuration according to the invention is also fulfilled in the exemplary embodiment according to FIG. 2 in which the line integral of the dimension in the y-direction is constant over the entire extent in the x-direction: this has already been demonstrated in the foregoing for the "basic shape" according to FIG. 1. The modification of this basic shape according to FIG. 2 cannot bring about any change in this respect since, as stated, the exemplary embodiment according to FIG. 2 has been obtained merely by displacing triangles of the image field configuration according to FIG. 1 in the y-direction.

Figure 3:
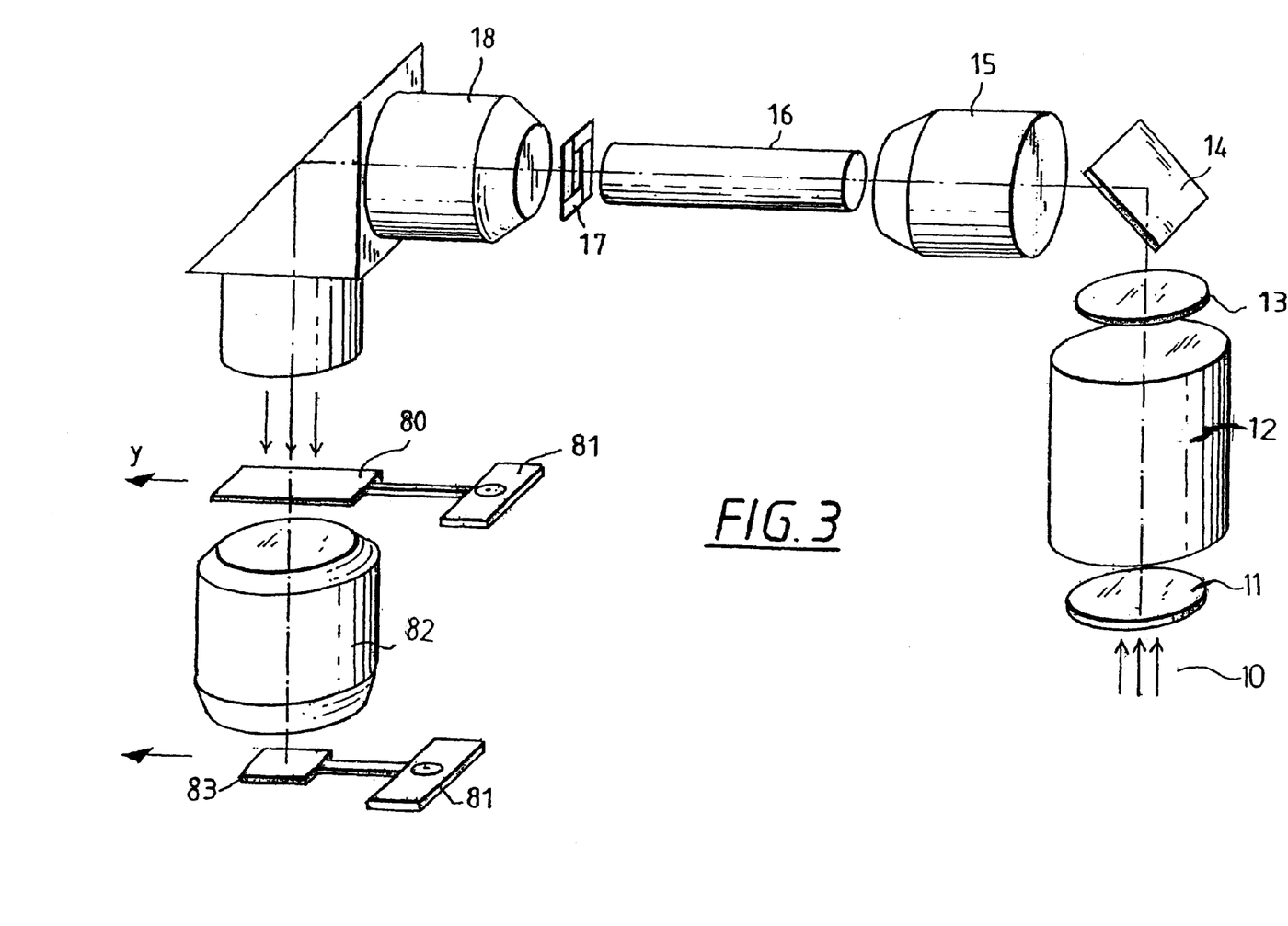
FIG. 3 schematically illustrates an illuminating device with which the image field configurations according to FIGS. 1 and 2 can be produced.

FIG. 3 illustrates a projection-microlithographic device in which the image field configurations according to FIG. 1 and FIG. 2 can be used. The basic construction of the illuminating device in this device is described in DE 195 20 563 A, which is incorporated herein by reference; in the following it will be explained with reference to FIG. 3 only to the extent required for the explanation of the present invention. Reference is made to DE 195 20 563 A with regard to details.

The illuminating device illustrated in FIG. 3 is preceded by a light source (not shown), for example a laser, the light beams of which are indicated by the arrows 10. The light passes through a first diffractive optical element 11. This forms the illuminating pupil and is arranged for this purpose in the object plane of an objective 12. Reference is made to the fore mentioned DE 195 20 563 A in respect of details of the design and function of this first diffractive optical element 11 and in respect of the various lenses which can form part of the objective 12.

A second diffractive optical element 13, the precise function and detailed design of which will be discussed in the following, is arranged in the exit pupil of the objective 12.

Having passed through the second diffractive optical element 13, the light is guided by a plane deflection mirror 14 into an input coupling optical device 15. This is again designed in accordance with the prior art and consequently need not be explained in detail here.

The light exiting from the input coupling optical device 15 falls onto the right hand end face, shown in FIG. 3, of a glass rod arrangement 16 also described in detail in the following, exits from this glass rod arrangement 16 through its left hand end face, and passes through an adjustable field diaphragm 17 (reticle masking system), as is known per se but here preferably defines the exact field configuration according to the invention. A downstream objective 18, containing a plane deflection mirror, images the field diaphragm 17, which is located in an intermediate field plane, onto the reticle 80.

The reticle 80 can be moved linearly in the y-direction with the aid of a scanning device 81.

The pattern on the reticle 80 radiated through the image field configuration is imaged by a projection objective 82 onto a wafer 83, which can be moved linearly in the y-direction in synchronism with the reticle 80 with the aid of a scanning device, and can thus be exposed.

The glass rod arrangement 16 can be constructed in different ways.

Figure 4:
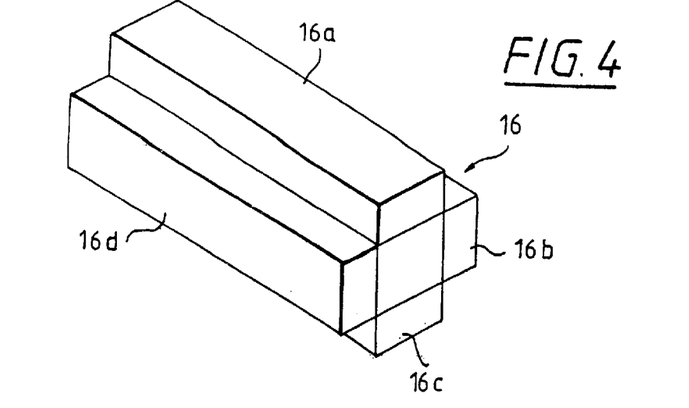
FIGS. 4 to 6 illustrate embodiments of glass rod arrangements that can be used in the illuminating device according to FIG. 3.

In the exemplary embodiment illustrated in FIG. 4, the glass rod arrangement 16 comprises an arrangement of four individual glass rods 16a to 16d, whose cross sectional shapes and arrangement are geometrically similar to the shapes and arrangement of the fields 1 to 4 in the image field configuration according to FIG. 1. Thus all the glass rods 16a to 16d have a rectangular cross section with an aspect ratio of 2:1 and adjoin one another with their edges such that they enclose a central, free space of square cross section.

Figure 5:
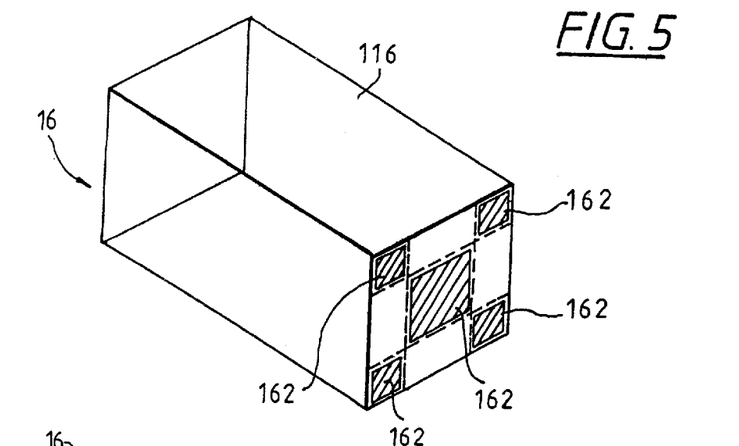

In FIG. 5 the glass rod arrangement 16 consists of one single glass rod 116 with a large rectangular cross section. At its exit end face, this glass rod is provided with reflective coatings 162 which are substantially complementary to the desired image field configuration (in the illustrated example to the image field configuration according to FIG. 1). These reflective coatings 162 serve as a mask that however only slightly impairs the light yield.

Figure 6:
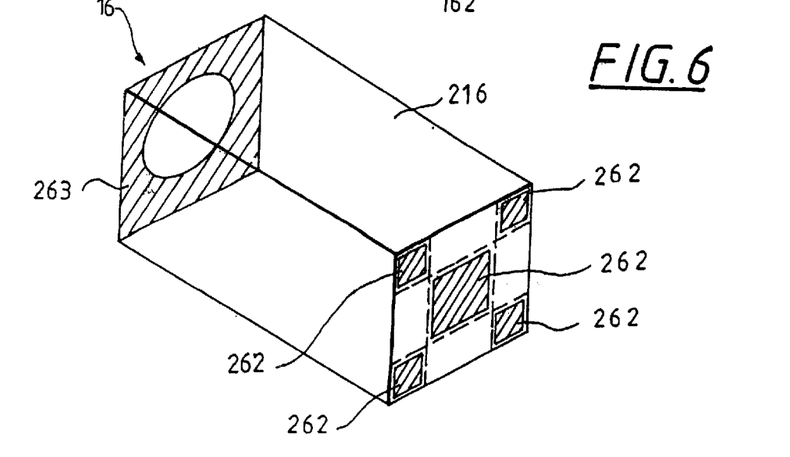

This principle has been further developed in the exemplary embodiment of the glass rod arrangement 16 according to FIG. 6. Like the arrangement according to FIG. 5, this consists of one single glass rod 216 having the previously described reflective coatings 262 at the exit end face. A further reflective coating 263 is additionally provided here at the entry end face. This reflective coating 263 has a central void that substantially corresponds to the cross section of the light beam here entering the glass rod 216. In this way multiple reflections which reduce the light loss can occur between the oppositely disposed reflective coatings 262 and 263.

Figure 7:
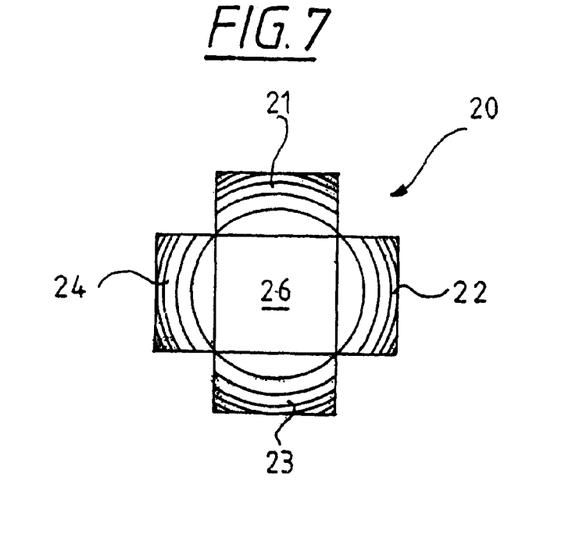
FIG. 7 illustrates the unit cell of the optically active structure of a diffractive optical element used in the illuminating device according to FIG. 3.

The function of the second diffractive optical element 13, referred to briefly in the foregoing, is to fill the entry end face of the glass rod arrangement 16 uniformly with light. A similar function is fulfilled by the second diffractive optical element according to DE 195 20 563 A in which only one single rectangular cross section of one single glass rod is to be filled. This can be used substantially unchanged to illuminate the glass rod arrangements 16 according to FIGS. 5 and 6. To be able to fill the entry end faces of a complicated glass rod arrangement 16, consisting of several glass rods 16a to 16d, homogeneously with light, as is necessary in the case of the embodiment according to FIG. 4, the optically active structure arranged on the second diffractive optical element 13 must be modified in relation to the known structure:

FIG. 7 illustrates a "unit cell" of the optically active structure of the second diffractive optical element 13. This unit cell 20 comprises four fields 21, 22, 23, 24 which, in a geometrically similar manner to the image field configuration according to FIG. 1, each consist of rectangles with an aspect ratio of 2:1 that adjoin one another such as to enclose a central square field 26. Only the rectangular fields 21 to 24 of the unit cell 20, which correspond to the fields 1 to 4 of the image field configuration shown in FIG. 1, have been provided with optically active structures. These are concentric circles whose center point lies at the center of the unit cell 20. Their detailed construction can correspond to that of a Fresnel lens or a binary diffractive phase profile lens, as described in detail in DE 195 20 563 A.

Figure 8:
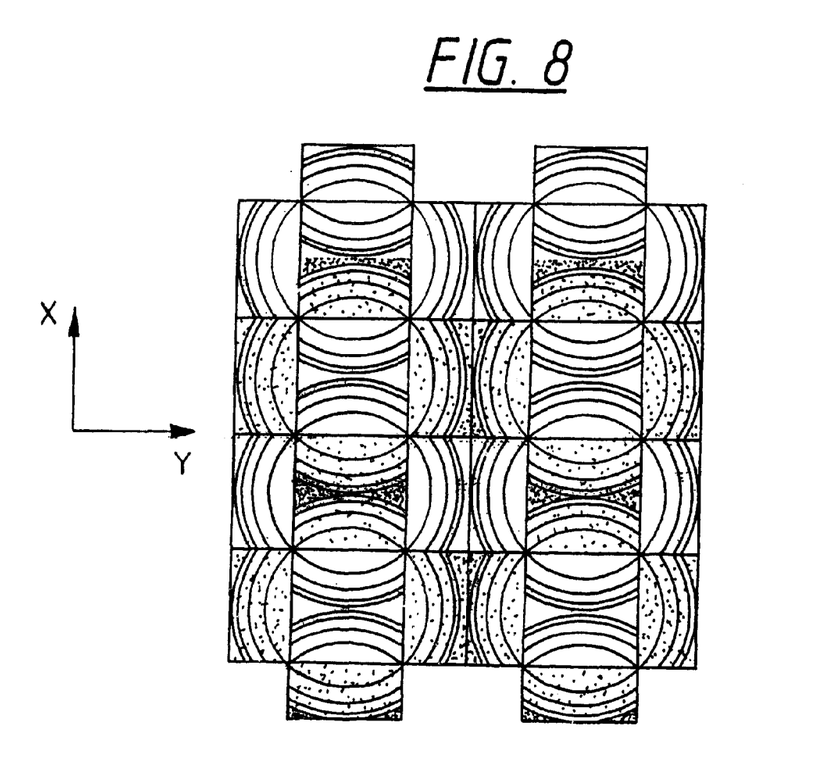
FIG. 8 illustrates the optically active structure of the diffractive optical element composed of unit cells according to FIG. 4.

From the "unit cell" 20 illustrated in FIG. 7, the "macroscopic", optically active structure arranged on the second diffractive optical element 13 is obtained by multiple assembly. This is illustrated in FIG. 8. FIG. 8 illustrates—in dark shading—a plurality of unit cells 20 according to FIG. 7 that are joined to one another by the respective, outwardly facing, narrow sides of the fields 21 to 24. Between the thus formed unit cells 20, initially free, square fields are formed that are similar to the fields 26 located in the center of the unit cell 20. In this way an overall arrangement is obtained that is similar to the pattern of a chess board. In a second step, a second set of unit cells 20 is superimposed upon this "chess board pattern" such that its free central field 26 is applied to a "dark" field of the chess board pattern formed in the intervening mental step. This gives rise to the structure of the second diffractive optical element 13 as shown in FIG. 8 in which there are no longer any free fields.

This structure can also be imagined to have been formed as follows: Following a relative displacement in the x-direction by the side length of a square, an identical second pattern is superimposed on an arrangement of a plurality of unit cells 20 corresponding to the dark areas in FIG. 8.

Figure 9:
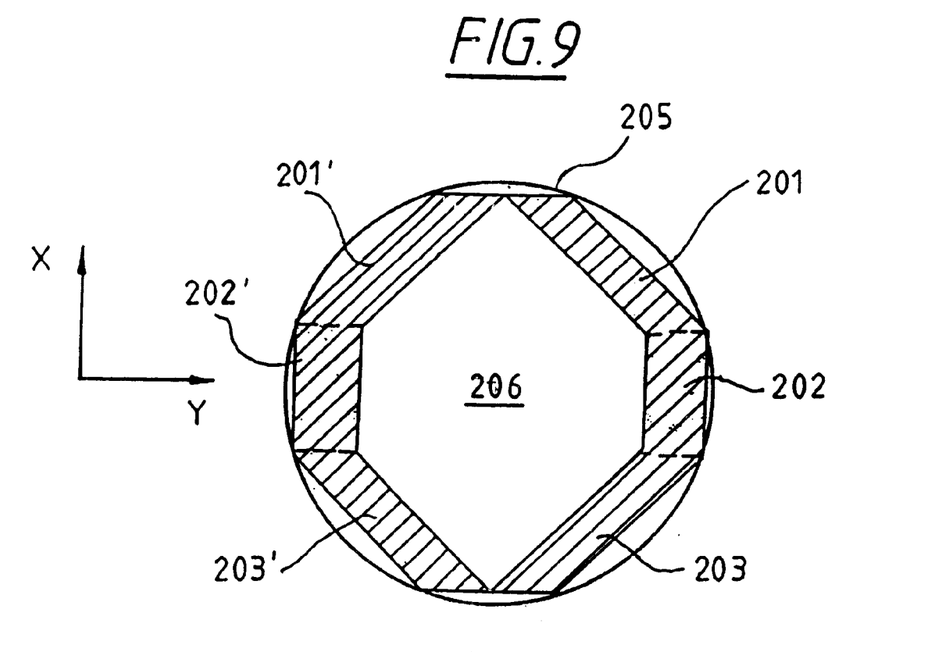
FIGS. 9 to 12 illustrate further embodiments of image field configurations that can be used instead of the image field configuration according to FIGS. 1 and 2.

A substantially loss free, homogeneous illumination of the left hand end face of the glass rod arrangement 16 as shown in FIG. 9 can be achieved with the aid of the second diffractive optical element 13 designed in this way.

Basically the same illuminating device can also be used to obtain the modified image field configuration illustrated in FIG. 2. For this purpose, for example the individual glass rods 16a to 16b in the glass rod arrangement 16 shown in FIG. 4 are slightly modified: They now acquire rectangular cross sectional shapes which correspond to the rectangular shapes in part supplemented by broken lines in FIG. 2, from which triangles have been cut off to form the fields 101, 102, 103 and 104 in the described manner. Thus in particular the two oppositely disposed glass rods in the glass rod arrangement 16 corresponding to the fields 101 and 103 in FIG. 2 have a rectangular profile which is somewhat larger in the x-direction than the rectangular profile of the two other glass rods, corresponding to the fields 102 and 104 in FIG. 2, in the y-direction. The four glass rods then no longer adjoin one another edge to edge, but overlap slightly in the x-direction. An additional diaphragm in the vicinity of the plane of the exit of the glass rod arrangement 16 serves to cut off the unrequired triangular sectors. This involves a small, but overall acceptable loss of light.

FIG. 9 illustrates a third image field configuration that can be used in a projection-microlithographic device instead of the image field configurations according to FIGS. 1 and 2. This image field configuration is likewise mirror symmetric to center lines extending in parallel to the y- and x-axis and at right angles to one another, but possesses only two fold rotation symmetry with respect to a central axis extending at right angles to the drawing plane in FIG. 6. This polygonal image field configuration can be imagined to have been formed from six fields in the following manner:

A first field 201 has the shape of a parallelogram, the narrow sides of which have a length corresponding to half the narrow side of a conventional rectangular scanner slot producing the same exposure effect. A second, rectangular field 202 seamlessly adjoins the imaginary narrow side of the field 201 illustrated in broken lines in FIG. 9. The field 202 continues via its lower, imaginary boundary line, again represented by a broken line, into a further parallelogram shaped field 203 symmetric to the field 201 with respect to the axis of symmetry extending in the y-direction.

Further fields 201', 202', 203' are arranged mirror symmetrically to the center line extending in parallel to the x-axis, at which center line the adjacent fields 201', 201 and 203', 203 contact one another only at their corners.

It can easily be seen that the image field configuration shown in FIG. 9 fulfils the basic condition of the present invention, that the line integral of the dimensions in the y-direction must be constant over the entire extent in the x-direction. The fields 201–203 are located within the circular boundary line 205, which is not necessarily coincident with the boundary line of the corrected image field of the projection objective. Both boundary lines may coincide but there may also be cases where the corrected image field of the projection objective is larger than the area defined by the circular boundary line passing through the outer corners of the image field, disclosed in FIGS. 1, 2 and 9–12.

Figure 10:
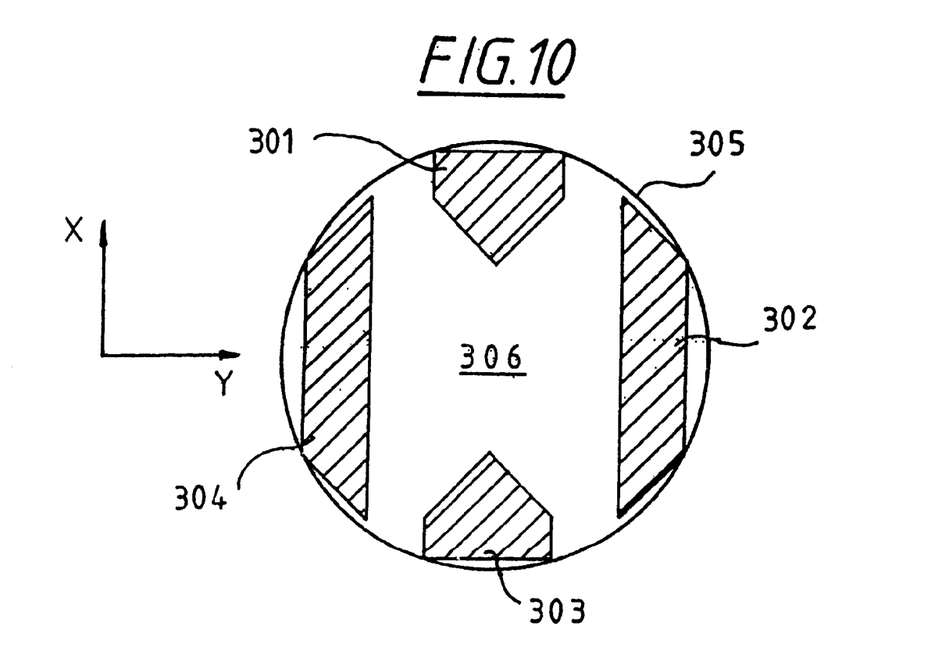
Figure 11:
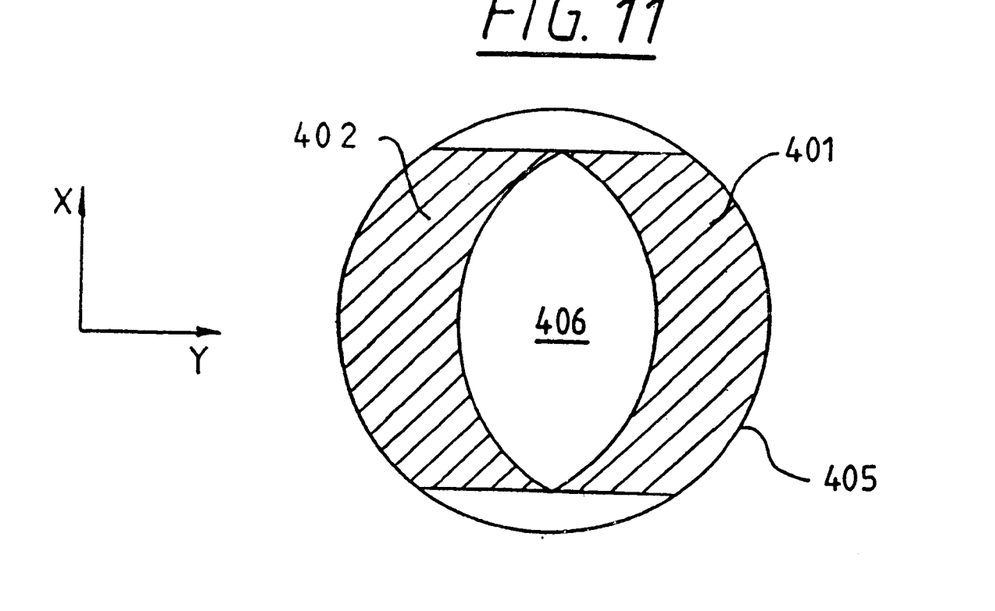

The image field configuration according to FIG. 10 obviously fulfils the same basic condition. This comprises four fields 301, 302, 303, 304 which do not touch at any point. Similarly, as in the case of the image field configuration according to FIG. 2, the fields 301 and 303 furthest removed from one another in the x-direction in FIG. 10 are "house shaped", and thus are formed by a rectangle and a triangle whose apex faces towards the center of the image field configuration. The dimension of the fields 301 and 303 in the y-direction corresponds to the width of a conventional rectangular scanner slot that produces the same exposure effect.

The fields 302 and 304 of the image field configuration according to FIG. 10 that are furthest removed from one another in the y-direction have the shape of equal sided trapeziums, similarly to the fields 102 and 104 in FIG. 2. However, whereas in the embodiment shown in FIG. 2 the shorter of the two parallel boundary lines of the trapeziums are arranged on the inside, the opposite is the case in the embodiment shown in FIG. 10: The shorter of the two parallel boundary lines are arranged on the outside. This has the advantage that the trapezium shaped fields 302 and 304 can be brought closer to the periphery 305 of the circular, corrected image field. This different arrangement of the trapezium shaped fields 302 and 304 obviously has no effect on the line integral of the dimensions of the fields 302 and 304 in the y-direction.

The image field configuration illustrated in FIG. 11 again is mirror symmetrical to the center line extending in parallel to the x-direction. It comprises two fields 401, 402 that have the approximate shape of a circular ring segment. The circular arc shaped boundary lines are not concentric however; rather, the two circular arc shaped lines have the same radius, although the center points are spaced from one another in the y-direction. This provides that, viewed in the y-direction, the fields 401 and 402, whose shape is similar to that of a circular ring segment, always have the same dimension independently of the x-direction. This dimension in the y-direction corresponds to half the width of an equivalent conventional rectangular slot.

Figure 12:
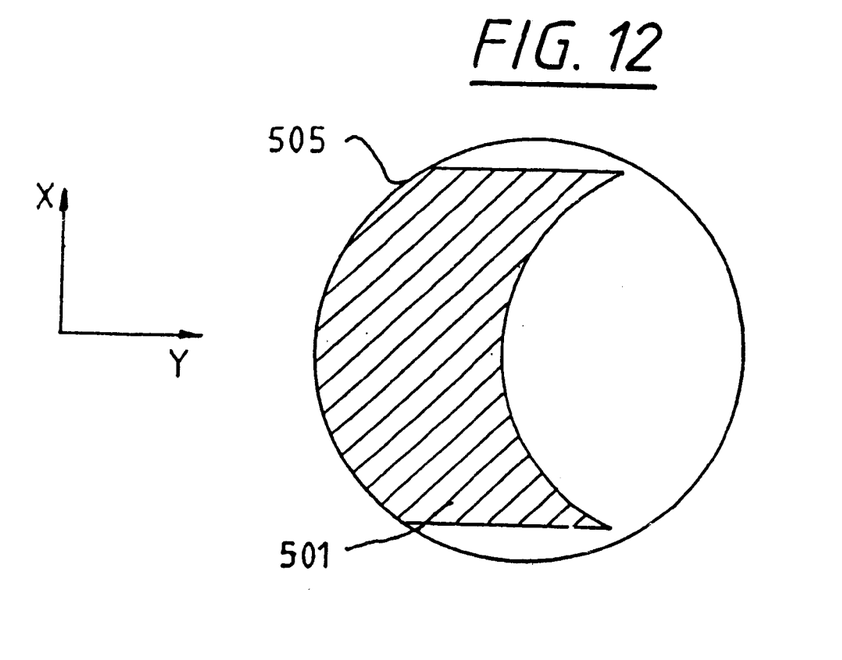

The image field configuration illustrated in FIG. 12 comprises only one single field 501 whose shape is similar to that of a circular ring segment. This field is likewise delimited on two opposite sides by circular arcs with the same radius, whose center points are spaced from one another in the y-direction. This spacing here corresponds to the width of an equivalent conventional rectangular slot.

Although the embodiment of the image field configuration illustrated in FIG. 12 is not particularly rotationally symmetric, the regions traversed by the light lie closer to the periphery of the circular, corrected image field 505 so that the heat discharge from the projection objective is simplified and for this reason smaller heat induced imaging errors occur in the projection objective.

Figure 13:
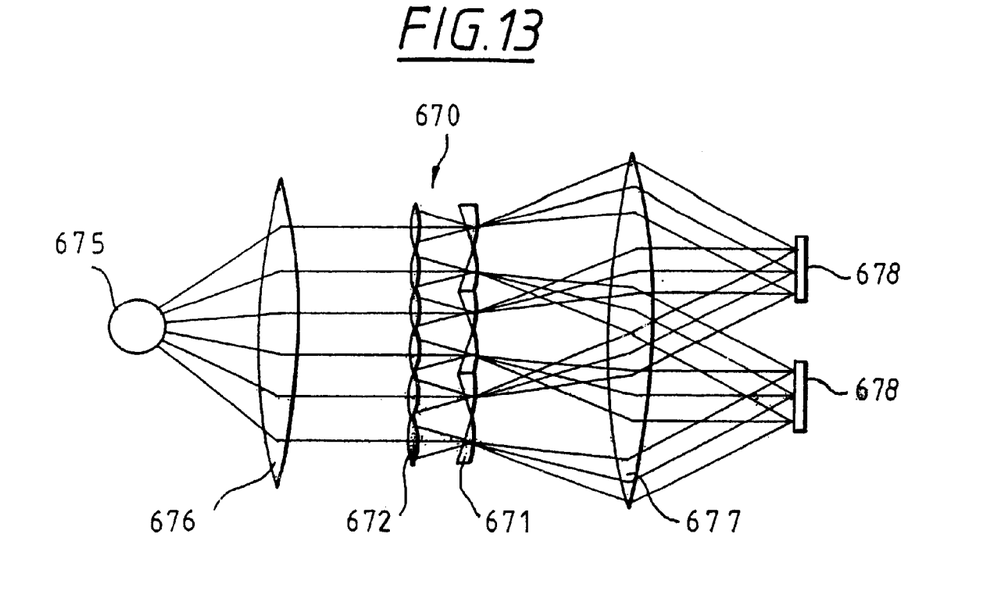
FIG. 13 illustrates a second exemplary embodiment of an illuminating device with a prism honeycomb condenser.

FIG. 13 illustrates a possible alternative design of the device that produces the desired image field configuration. In FIG. 13 the light emanating from a light source 675 is parallelized by a collector lens 676 and then passes through a prism honeycomb condenser 670. The basic construction of such a honeycomb condenser is known. At the entry side it comprises a field honeycomb arrangement 672 and on the exit side a pupil honeycomb arrangement 671, such that from the incident parallel light, the individual honeycomb cells produce a plurality of light beams exiting in different directions. These light beams are then imaged on the reticle 678 by a field lens 677 so that, at least in first approximation, the desired image field configuration, which in the illustrated embodiment is divided, is formed thereon.

Figure 14:
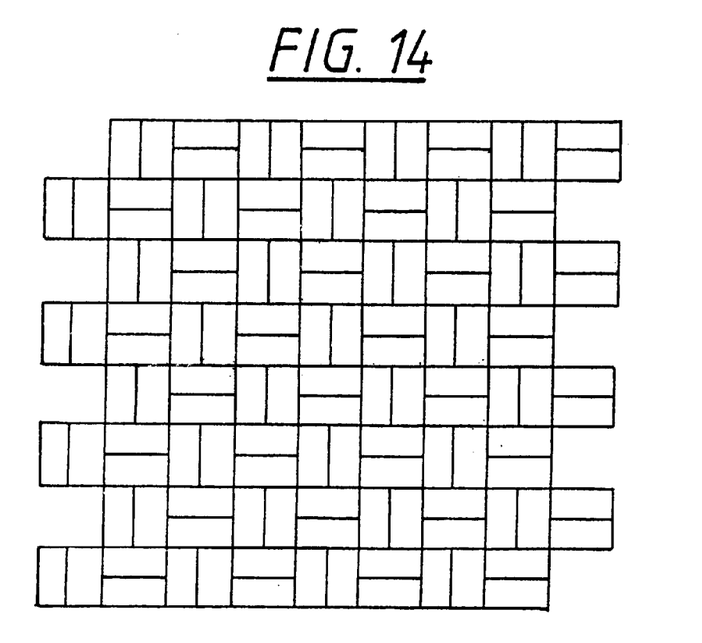
FIGS. 14 and 15 illustrate two field honeycomb arrangements that can be used in the prism honeycomb condenser according to FIG. 13.
Figure 15:
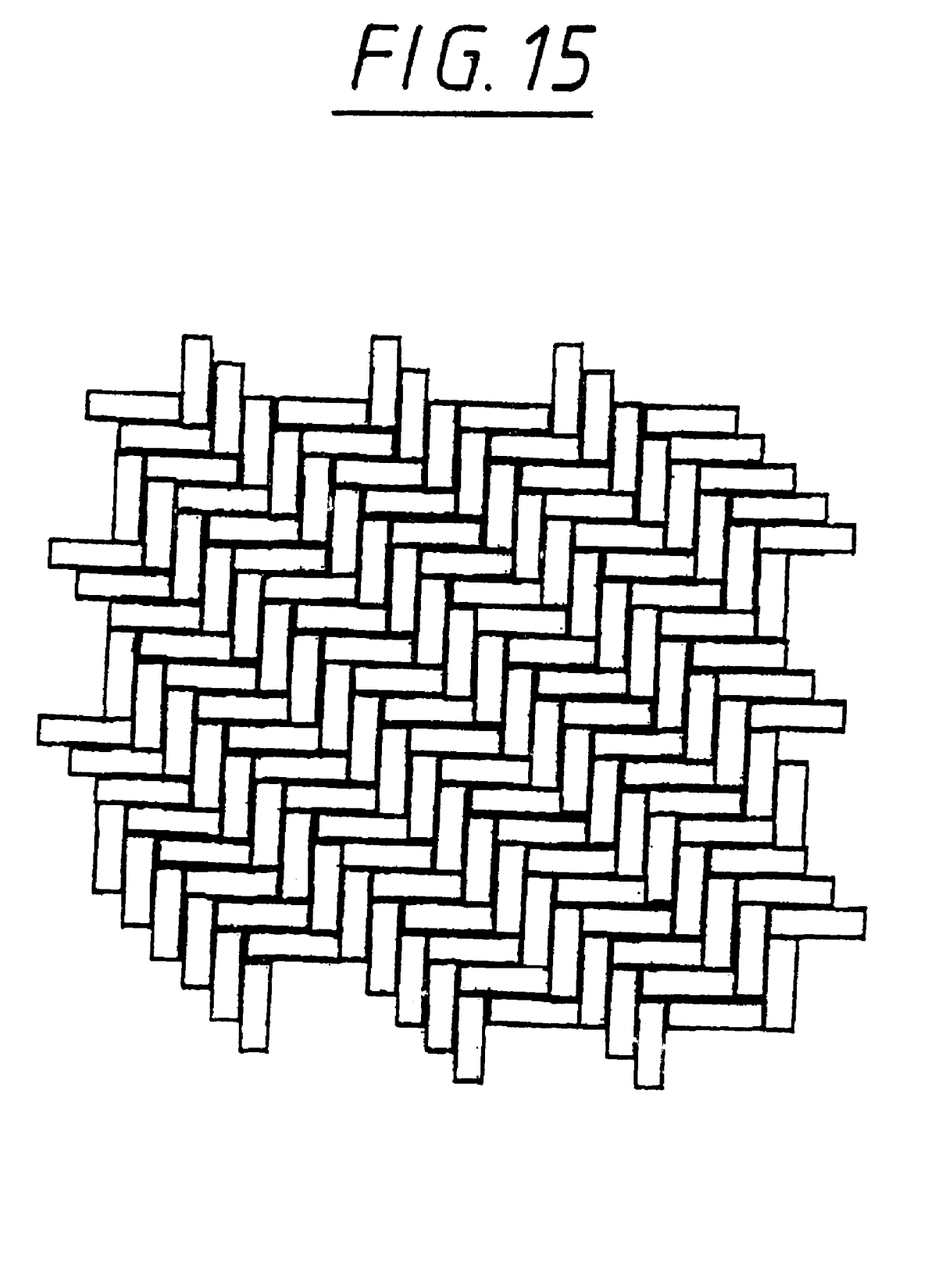

Field honeycomb arrangements with which this result can be achieved are illustrated in FIGS. 14 and 15.

Figure 16:
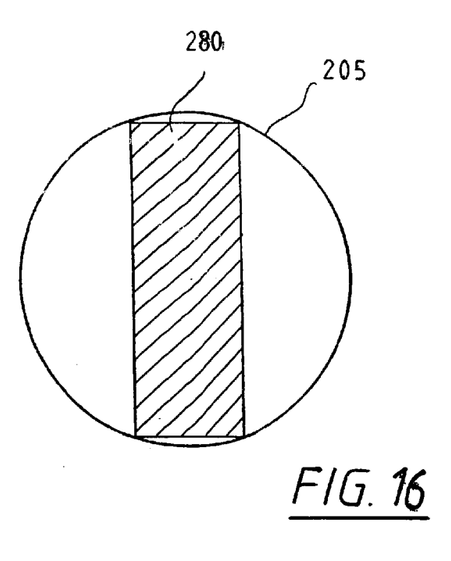
FIGS. 16 to 18 show intermediate imaging steps to produce the image field configuration of FIG. 9.

The image field configuration of FIG. 9 is produced with the help of intermediate imaging steps as is explained below with respect to FIGS. 16 and 18:

FIG. 16 shows a starting image field configuration that is a rectangular image field 280 with an aspect ratio of approximately 3:1. The outer corners of the image field 280 define the circular boundary line 205 that is not necessarily coincident with the boundary line of the corrected image field.

Figure 17:
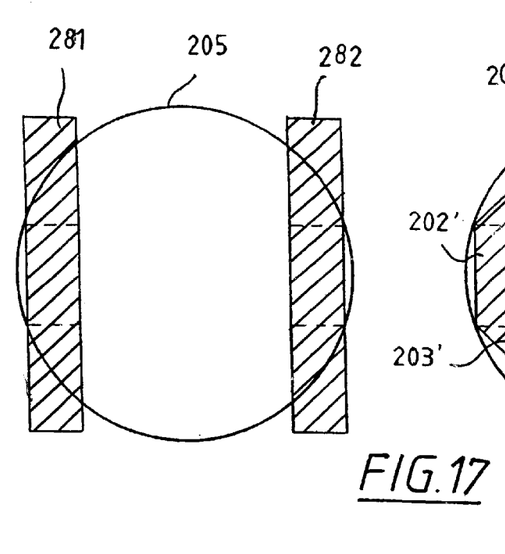

In a first imaging step, the image field 280 is parted and the resulting parts 281, 282 being rectangular with an aspect ratio of approximately 6:1 are taken apart leading to the intermediate image field configuration of FIG. 17. As can be seen, using this image field configuration, which is known in the state of the art, the resulting parts 281, 282 cannot be located within the circular boundary line 205 of the initial rectangular image field 280.

Figure 18:
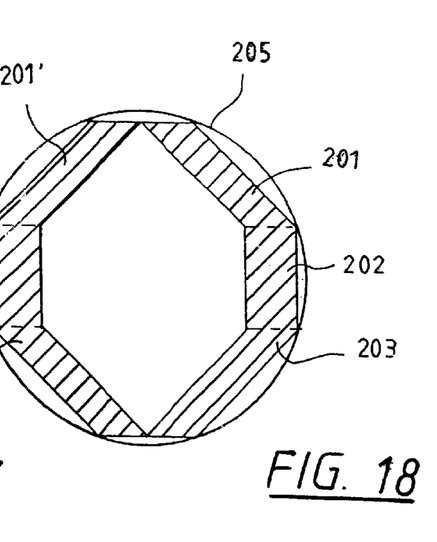

In a second imaging step, those parts of the intermediate rectangles 281, 282 (FIG. 17) that protrude over the circular boundary line 205 are reshaped by an imaging step which is length preserving in a y-direction to give the four parallelograms 201, 201', 203 and 203' (see FIG. 18 and compare FIG. 9). These parallelograms 201 to 203' are entirely located within the circular boundary line 205.

The generated image field configuration according to the FIG. 18 exploits the image height of the initially rectangular image field configuration 280 fully as it is generated by imaging steps that are also length preserving in the x-direction, i.e. in the direction of the long rectangle side of the initial image field configuration 280 and as the resulting image field configuration 201 to 203, 201' to 203' is located with its outer corners on the circular boundary line 205.

By virtue of the fact that the image field formation of the above described image field configurations approximates rotation symmetry—albeit in part very roughly—asymmetrical illumination of the optical components of the projection objective occurs to a much lesser extent than in the case of the known narrow scanner slots. Consequently, the occurrence of non-rotationally symmetric, heat or radiation induced imaging errors in the projection objective can be substantially suppressed without the need to intervene in the construction principles of the projection objective or to effect complicated changes in the illuminating device.

What is claimed is:

1. A projection-microlithographic apparatus comprising:
an illuminating device which itself comprises:
a light source;
a device which produces an image field configuration in a reticle plane;
being designed such that an image field configuration is produced by a transformation of an initial rectangle having a long side and a short side with an aspect ratio greater than 1:5, said transformation being such as to keep the area and, in the direction of the long side of the rectangle, the total dimension constant; said generated image field configuration having at least two closed curves as periphery;
a reticle holder which is designed to accommodate a reticle in the reticle plane and is movable in a scanning direction;
a projection objective imaging a pattern of the reticle located in the reticle plane onto a wafer plane; wherein
the device which produces the image field configuration is designed such that both the corners of the initial rectangle from which the image field configuration is generated and at least the outer corners of the image field configuration generated from this initial rectangle are located on a circular boundary line of a circular corrected image field of the projection objective, and that, otherwise, the image field configuration produced is located within the circular corrected image field.

2. The projection-microlithographic apparatus according to claim 1, wherein, the device which produces the image field configuration is designed such that the image field configuration fulfills the following conditions:
the device comprises fields which in the scanning direction are separated from one another at least in parts by a free field and, in a manner approximating rotation symmetry, are located in the peripheral region of the circular image field of the projection objective;
an integral of the quantity of light passing through the fields in the scanning direction is constant over the entire extent of the image field configuration in the direction at right angles to the scanning direction.

3. The projection-microlithographic apparatus according to claim 2, wherein the integral of the dimensions of the fields in the scanning direction is constant over the entire extent of the image field configuration in the direction at right angles to the scanning direction.

4. The projection-microlithographic apparatus according to claim 1, wherein the image field configuration is axially symmetric to a center line extending in parallel to the direction at right angles to the scanning direction.

5. The projection-microlithographic apparatus according to claim 1, wherein the image field configuration possesses at least two-fold rotation symmetry with respect to a central axis extending at right angles to its plane.

6. The projection-microlithographic apparatus according to claim 1, wherein the image field configuration comprises four rectangular fields which adjoin one another such that they enclose a rectangular, free field.

7. The projection-microlithographic apparatus according to claim 6, wherein the rectangular free field is at least an approximate square and that the four fields are at least approximate rectangles with an aspect ratio of 2:1.

8. The projection-microlithographic apparatus according to claim 1, wherein the image field configuration, comprises a plurality of rectangular fields and/or fields in the form of parallelograms assembled in the manner of a polygon.

9. The projection-microlithographic apparatus according to claim 1, wherein the fields are delimited by two parallel lines extending in the direction at right angles to the scanning direction and, where they continue in the direction at right angles to the scanning direction in the form of another field adjoining in the scanning direction, have an obliquely extending boundary line, where the adjacent fields overlap in the direction at right angles to the scanning device in the region of the obliquely extending boundary lines.

10. The projection-microlithographic apparatus according to claim 1, wherein the image field configuration comprises at least one field resembling a circular segment which is delimited on two opposite sides by circular arcs of equal radius whose center points are spaced from one another in the scanning direction and is delimited on two opposite sides by straight lines extending in parallel to the scanning direction.

11. The projection-microlithographic apparatus according to claim 10, wherein two fields resembling circular ring segments are disposed mirror-symmetrically to the center line extending in parallel to the direction at right angles to the scanning direction.

12. The projection-microlithographic apparatus according to claim 1, wherein the device which produces the image field configuration comprises at least one glass rod.

13. The projection-microlithographic apparatus according to claim 12, wherein at its exit end face the glass rod bears reflective coatings such that the portion of the exit end face of the glass rod which is free of reflective coatings is at least approximately geometrically similar to the image field configuration.

14. The projection-microlithographic apparatus according to claim 13, wherein at its entry end face the glass rod bears a reflective coating which substantially leaves free only the cross-section of the light beam entering the glass rod.

15. The projection-microlithographic apparatus according to claim 12, wherein the device which produces the image field configuration comprises a plurality of glass rods whose cross-sections are selected and arranged such that their exit end faces form a pattern which is at least approximately geometrically similar to the image field configuration.

16. The projection-microlithographic apparatus according to claim 12, further comprising a second device which homogenizes the spatial distribution of the intensity of the light exiting from the device which produces the image field configuration.

17. The projection-microlithographic apparatus according to claim 16, wherein the second device is a grey filter.

18. The projection-microlithographic apparatus according to claim 16, wherein the second device is an adjustable diaphragm.

19. The projection-microlithographic apparatus according to claim 12, wherein the device which produces the image field configuration comprises a diffractive or refractive, optical element whose optically active structure is designed such that the at least one entry end face of the at least one glass rod is illuminated in a substantially loss-free and uniform manner.

20. The projection-microlithographic apparatus according to claim 19, wherein the optically active structure of the diffractive or refractive, optical element comprises a unit cell with optically active fields whose arrangement and shape are at least approximately geometrically similar to the arrangement and shape of the fields of the image field configuration.

21. The projection-microlithographic apparatus according to claim 1, wherein the device which produces the image field configuration comprises a prism-honeycomb condenser whose honeycomb cells are arranged such that they produce an image field configuration which is at least approximately geometrically similar to the desired image field configuration.

22. The projection-microlithographic apparatus according to claim 1, further comprising a mask which imparts an exact formation to the image field configuration.

23. A projection-microlithographic device comprising:
    an illuminating device which itself comprises:
    a light source;
    a device which produces an image field configuration in a reticle plane;
    a reticle holder which is designed to accommodate a reticle in the reticle plane and is moveable in a scanning direction;
    a projection objective which projects a pattern of a reticle located in the reticle plane onto a wafer plane; wherein,
    the device which produces the image field configuration comprises at least one glass rod bearing reflective coatings at its exit end face such that the portion of the exit end face of the glass rod which is free of reflective coatings is at least approximately geometrically similar to the image field configuration.

24. The projection-microlithographic apparatus according to claim 23, wherein at its entry end face the glass rod bears a reflective coating which substantially leaves free only the cross-section of the light beam entering the glass rod.

25. The projection-microlithographic apparatus according to claim 23, wherein the device which produces the image field configuration comprises a plurality of glass rods whose cross-sections are selected and arranged such that their exit end faces form a pattern which is at least approximately geometrically similar to the image field configuration.

* * * * *